United States Patent
Gabriel et al.

(10) Patent No.: US 7,135,396 B1
(45) Date of Patent: Nov. 14, 2006

(54) METHOD OF MAKING A SEMICONDUCTOR STRUCTURE

(75) Inventors: Calvin T. Gabriel, Cupertino, CA (US); Jeffrey Shields, Sunnyvale, CA (US)

(73) Assignees: Spansion LLC, Sunnyvale, CA (US); Advanced Micro Devices, Inc., Austin, TX (US)

( * ) Notice: Subject to any disclaimer, the term of this patent is extended or adjusted under 35 U.S.C. 154(b) by 311 days.

(21) Appl. No.: 10/939,775

(22) Filed: Sep. 13, 2004

(51) Int. Cl.
H01L 21/44 (2006.01)
H01L 21/4763 (2006.01)
H01L 31/00 (2006.01)
H01L 29/00 (2006.01)
H01L 23/48 (2006.01)

(52) U.S. Cl. .............. 438/612; 438/582; 438/656; 438/683; 438/685; 438/687; 438/785; 257/459; 257/503; 257/762; 257/779; 106/14.05; 252/387; 392/457; 205/350

(58) Field of Classification Search ............ None
See application file for complete search history.

(56) References Cited

U.S. PATENT DOCUMENTS

| 5,882,489 A * | 3/1999 | Bersin et al. ........ 204/192.35 |
| 6,656,763 B1 | 12/2003 | Oglesby et al. |
| 6,686,263 B1 | 2/2004 | Lopatin et al. |
| 6,746,947 B1 * | 6/2004 | Daubenspeck et al. .... 438/601 |
| 6,746,971 B1 | 6/2004 | Ngo et al. |
| 6,753,247 B1 | 6/2004 | Okoroanyanwu et al. |
| 6,753,954 B1 | 6/2004 | Chen |
| 6,768,157 B1 | 7/2004 | Krieger et al. |
| 6,770,905 B1 | 8/2004 | Buynoski et al. |
| 6,781,868 B1 | 8/2004 | Bulovic et al. |
| 6,787,458 B1 | 9/2004 | Tripsas et al. |
| 2003/0064578 A1 * | 4/2003 | Nakamura et al. ........ 438/627 |
| 2003/0082850 A1 * | 5/2003 | Akram ................ 438/106 |
| 2003/0203706 A1 * | 10/2003 | Shih et al. ............. 451/37 |
| 2004/0000580 A1 * | 1/2004 | Lee et al. ............. 228/220 |
| 2005/0059232 A1 * | 3/2005 | Andreas .............. 438/627 |
| 2006/0016861 A1 * | 1/2006 | Daubenspeck et al. 228/180.21 |
| 2006/0163582 A1 * | 7/2006 | Lee et al. .............. 257/66 |

OTHER PUBLICATIONS

Kaori Tai, "New Complementary PVD-Ta/CVD-WN Stacked Barrier Structure for Copper Metallization", IEEE 2002, p. 194-196.*

* cited by examiner

Primary Examiner—Carl Whitehead, Jr.
Assistant Examiner—James M. Mitchell
(74) Attorney, Agent, or Firm—Amin & Turocy, LLP

(57) ABSTRACT

Methods of making a semiconductor structure are disclosed. A refractory metal layer containing W, TiW, Ta, or TaN and semiconductor layer are formed on a substrate that contains copper in, for example, a via therein. A portion of the refractory metal layer and semiconductor layer is removed by etching using a fluorine-containing compound. By using W, TiW, Ta, or TaN as the refractory metal layer material and employing fluorine-based etching, the copper portion in the substrate is not substantially etched, thus preventing corrosion of the copper portion.

20 Claims, 2 Drawing Sheets

METHOD OF MAKING A SEMICONDUCTOR STRUCTURE

TECHNICAL FIELD

The subject invention relates generally to semiconductor structure fabrication, and more particularly methods for preventing corrosion of a copper portion of semiconductor structure during the manufacture of semiconductor devices.

BACKGROUND ART

In the semiconductor industry, there is a continuing trend toward higher device densities. To achieve these high densities there have been, and continue to be, efforts toward scaling down device dimensions (e.g., at sub-micron levels) on semiconductor wafers. In order to accomplish such high device packing densities, smaller feature sizes and more precise feature shapes are required. This may include the width, thickness and spacing of interconnecting lines, spacing and diameter of contact holes, and the surface geometry, such as corners and edges, of various features.

The requirement of small features with close spacing between adjacent features requires sophisticated manufacturing techniques to ensure that quality and operability of the features are not compromised for the purpose of reducing feature size. Among the many aspects related to improving semiconductor fabrication processing to achieve higher density devices, the ability to form patterned thin films, which are substantially free from impurities and defects, remains critical to the structural integrity of smaller features as well as to the performance of the device with respect to increasing the speed of the device. Even minor impurities or defects present in the semiconductor structure tend to result in poor device characteristics, thereby reducing the effectiveness of the semiconductor device.

Thus, an efficient method to form a thin film is desired to increase productivity, quality, and reliability in IC manufacture.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention relates a method for preventing corrosion of a copper portion in a semiconductor structure while processing the semiconductor structure. The subject invention provides upon processes for fabrication of the semiconductor structure. A method of making a semiconductor structure in accordance of the subject invention includes forming a refractory metal layer over a substrate comprising copper, and forming a semiconductor layer over the refractory metal layer. Then, a portion of the refractory metal layer and the semiconductor layer on the substrate layer is removed by etching using a fluorine-containing compound and the substrate comprising copper is substantially unetched.

Another aspect of the subject invention relates a method for preventing corrosion of a copper portion in a semiconductor structure while processing or making a diode. The method of making the diode includes providing a substrate layer having a copper portion; forming a refractory metal layer over the substrate layer, and forming a semiconductor layer comprising Ge over the refractory metal layer. Then, a portion of the refractory metal layer and the semiconductor layer on the substrate layer is removed by etching using a fluorine-containing compound and the substrate comprising copper is substantially unetched.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

Figure 1:
FIGS. 1 to 4 are cross sectional illustrations of a semiconductor structure undergoing fabrication according to one aspect of the subject invention.

The subject invention relates a method for preventing corrosion of a copper portion in a semiconductor device while processing the semiconductor device. The method includes forming a refractory metal layer over a substrate comprising copper, the refractory metal layer comprising at least one selected form a group consisting of W, TiW, Ta, and TaN; forming a semiconductor layer over the refractory metal layer; and removing a portion of the refractory metal layer and the semiconductor layer on the substrate layer by etching using a fluorine-containing compound and the substrate comprising copper substantially unetched.

Another aspect of the subject invention relates a method for preventing corrosion of a copper portion in a diode while processing or making the diode or a semiconductor structure. The method includes providing a substrate layer having a copper portion therein; forming a refractory metal layer over the substrate layer, the refractory metal layer comprising at least one selected form a group consisting of W, TiW, Ta, and TaN; forming a semiconductor layer comprising Ge over the refractory metal layer; and removing a portion of the refractory metal layer and the semiconductor layer on the substrate by etching using a fluorine-containing compound and the copper portion substantially unetched.

In the manufacture of certain types of electronic devices such as diodes and memories, both a refractory metal layer and a copper portion may be used in a semiconductor structure. The refractory metal layer may be employed as low-resistivity interconnect and contact barrier in the semiconductor structure. The copper portion may be employed as a conductive layer or via in the semiconductor structure.

In a memory cell, the copper portion may be employed as an electrode layer. The memory cells contain at least two electrodes, as one or more electrodes may be deposited between the two electrodes that sandwich the controllably conductive media. Typically, the thickness of each electrode is independently about 0.01 µm or more and about 10 µm or less. The electrodes may be made of conductive material, such as conductive metal (e.g., copper), conductive metal alloys (e.g., copper alloy), conductive metal oxides, conductive polymer films, semiconductive materials, and the like.

The controllably conductive media, placed between the two electrodes can be rendered conductive or non-conductive in a controllable manner using an external stimulus. Generally, in the absence of an external stimulus, the controllably conductive media is non-conductive or has a high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, and a semiconductive state.

The controllably conductive media can be rendered conductive, non-conductive or any state therebetween (degree of conductivity) in a controllable manner by an external stimulus (external meaning originating from outside the controllably conductive media). For example, under an external electric field, radiation, and the like, a given non-conductive controllably conductive media is converted to a conductive controllably conductive media.

The controllably conductive media contains one or more active layers and one or more passive layers. Typically, the active layer has a thickness of about 0.001 µm or more and about 5 µm or less. The active layer can be formed using any suitable low conducting material. Examples of materials that can be used in the formation of the active layer include organic semiconductor materials, inorganic semiconductor materials, and mixtures of organic and inorganic semiconductor materials. General examples of the low conducting inorganic materials include transition metal sulfides, chalcogenides, and transition metal oxides. Examples of inorganic materials include copper oxide ($CuO$, $Cu_2O$), iron oxide ($FeO$, $Fe_3O_4$), manganese oxide ($MnO2$, $Mn_2O_3$, etc), titanium oxide ($TiO_2$). General examples of the organic semiconductor materials include at least one of an organic material (such as a conjugated organic monomer, oligomer, or polymer (e.g., polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene)), an organometallic compound (such as a conjugated organometallic compound), an organometallic material (such as a conjugated organometallic monomer, oligomer, or polymer), a Buckyball, a carbon nanotube (such as a C6–C60 carbon nanotubes), and the like.

The passive layer can contain at least one conductivity-facilitating compound that contributes to the controllably conductive properties of the controllably conductive media. The conductivity-facilitating compound has the ability to donate and accept charges (holes and/or electrons). The passive layer thus may transport between an electrode and the organic polymer layer/passive layer interface, facilitate charge/carrier injection into the organic polymer layer, and/or increase the concentration of a charge carrier in the organic polymer layer. Examples of conductivity facilitating compounds that may constitute the passive layer include one or more of copper sulfide ($Cu_xS$, $1 \leq x \leq 2$), copper rich copper sulfide ($Cu_3S$, $Cu_2S$), copper oxide ($CuO$, $Cu_2O$), copper selenide ($Cu_2Se$, $CuSe$), copper telluride ($Cu_2Te$, $CuTe$), indium oxide ($I_3O_4$), silver sulfide ($Ag_2S$, $AgS$), gold sulfide ($Au_2S$, $AuS$), iron oxide ($Fe_3O_4$), cobalt arsenide ($CoAs_2$), nickel arsenide ($NiAs$), and the like. Typically, the passive layer containing the conductivity facilitating compound has a thickness of about 2 Å or more and about 0.1 µm or less.

When copper is present in the layer or the via that is adjacent to or near the refractory metal layer in a semiconductor structure, an etchant having a chlorine or bromine component may corrode the copper portion in the semiconductor structure due to the high reactivity of these compounds with copper while the refractory metal layer is etched. The corrosion of copper can happen even if the copper portion is covered by a thin film. Moreover, post-etch corrosion can occur if there are residual etchant compounds having a chloride or bromine component in the semiconductor structure. The corrosion has a negative impact on the quality of the manufactured electronic device by altering the desired electrical properties of and interactions between components on the manufactured device.

In the method of processing or making a semiconductor structure in accordance with the subject invention, a fluorine etchable material such as tungsten (W), titanium tungsten (TiW), tantalum (Ta), or tantalum nitride (TaN) is employed as a refractory metal layer in the semiconductor structure when copper will be exposed or nearly exposed to an etchant. Using a fluorine-containing etchant prevents exposure of the copper portion in the semiconductor structure to the corrosive chlorine or bromine, or even residual chlorine or bromine, thus preventing corrosion of the copper portion in the semiconductor device.

Referring to FIGS. 1 to 4 and FIGS. 5 to 7, two of many possible exemplary embodiments of processing or making a semiconductor structure are illustrated. Specifically FIG. 1 shows a cross sectional view of a substrate layer 100 containing copper. The substrate layer 100 may contain any suitable substrate material on which electric device such as a diode may be formed, including a semiconductor material (e.g., Group IV semiconductors such as silicon and germanium; Group III-V semiconductors such as gallium arsenide and indium phosphide; Group II-VI semiconductors; and polysilicon), an oxide material (e.g., silicon dioxide, magnesium oxide, and indium-tin-oxide), sapphire, glass, a single semiconductor layer (e.g., silicon nitride), a multi-layer structure that includes, for example, a semiconductor device (e.g., a light-emitting diode, a semiconductor laser, an organic semiconductor memory, and an electronic device), polymeric resins (e.g., polyamide), and ceramics.

When the substrate layer 100 is a dielectric layer, any suitable dielectric material can be used as the substrate layer 100. Both organic and inorganic dielectric materials may be used. Similarly, both low and high k dielectrics may be used. Also polymeric, amorphous, crystalline and monomeric materials can be used as dielectric materials. Non-limiting examples of dielectric materials include silicon containing spin-on glasses such as alkoxysilane polymer, a siloxane polymer, a silsesquioxane polymer, a poly(arylene ether), a fluorinated poly(arylene ether), other polymer dielectrics, nanoporous silica or mixtures thereof.

The substrate layer 100 can be formed by any suitable techniques. For example, chemical vapor deposition (CVD) such as plasma enhanced chemical vapor deposition (PECVD), low pressure chemical vapor deposition (LPCVD), and high pressure chemical vapor deposition (HPCVD) can be used. Polymeric dielectrics can also be formed by using spin-coating, dip-coating, or spraying.

The substrate layer 100 contains at least copper. The substrate layer 100 may have an opening 102 formed therein and contain copper in the opening 102. The opening 102 may be a via, trench, or line. The opening 102 can be formed by employing any suitable techniques. For example, the opening 102 can be formed by a lithography process followed by etching. Lithography can use both positive and negative resists, which are available commercially. Lithographic techniques for forming openings 102 in a substrate layer are well known in the art. Any etching process can be used for forming the opening 102. For example, a plasma etch can be used to form the opening 102. The resist is completely removed from the substrate layer surface and the inside walls of the opening 102 by plasma etching. The opening 102 can have relatively vertical sidewalls which extend perpendicular to the topological surface of the substrate layer 100.

Figure 2:
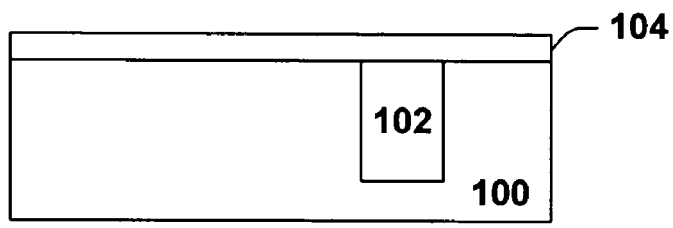

FIG. 2 shows forming of a refractory metal layer 104 over the substrate layer 100. The refractory metal layer 104 may be formed over the substrate layer 100 and the opening 102 containing copper. In the fabrication of high-density semiconductor devices, refractory materials may be used as low-resistivity interconnect and contact barrier.

The refractory metal layer 104 contains at least one selected from a group consisting of W, TiW, Ta, and TaN (although minor amounts (less than about 5% by weight) of other components may be present). Any refractory metal material containing W, TiW, Ta, or TaN can be used as the refractory metal layer 104, as long as the refractory metal layer 104 can be etched by a fluorine-containing etchant. For example, the refractory metal layer 104 may be a $Ti_{0.1}W_{0.9}$ alloy.

The refractory metal layer 104 is formed by any suitable thin layer formation techniques. For example, CVD (e.g., atmospheric pressure CVD (APCVD), low-pressure CVD (LPCVD), plasma-enhanced CVD (PECVD), and high density plasma (HDP), metal organic CVD (MOCVD), pulsed laser deposition (PLD), and atomic layer CVD (ALCVD)), physical vapor deposition (PVD) (e.g., evaporation, implantation, and sputtering), and the like can be used. Choice of a suitable formation technique depends primarily on the identity of the refractory metal layer 104 material, size of substrates being processed, and to some extent, the composition of a dielectric layer 100. It is important to understand that each of the various layer formation components has its own set of features and characteristics well known in the art.

The refractory metal layer 104 has a suitable thickness that depends upon the chosen implementations and/or the semiconductor device being fabricated. In one embodiment, the thickness of refractory metal layer 104 is about 0.01 µm or more and about 10 µm or less. In another embodiment, the thickness of refractory metal layer 104 is about 0.05 µm or more and about 5 µm or less. In yet another embodiment, the thickness of refractory metal layer 104 is about 0.1 µm or more and about 1 µm or less. In one embodiment, a metal of, for example, $Ti_{0.1}W_{0.9}$ is sputter deposited to a thickness of about 2,000 Å over the substrate 100.

Figure 3:
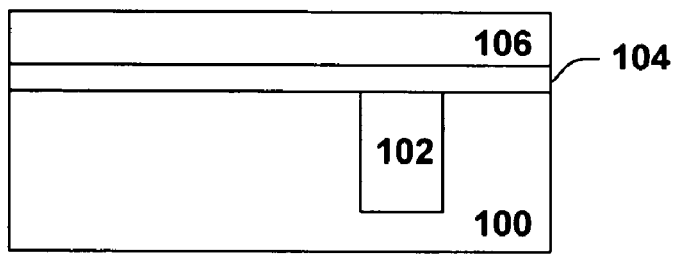

FIG. 3 shows forming of a semiconductor layer 106 over the refractory metal layer 104. The semiconductor layer 106 may contain any suitable semiconductor material, including a semiconductor material (e.g., Group IV semiconductors such as silicon (Si) and germanium (Ge); Group III-V semiconductors such as gallium arsenide (GaAs), gallium nitride (GaN), and indium phosphide (InP); Group II-VI semiconductors; and polysilicon). In one embodiment, the semiconductor layer 106 contains Ge.

The semiconductor layer 106 is formed by any suitable techniques. For example, the semiconductor layer 106 may be formed by chemical vapor deposition (CVD) optionally including a gas reaction or gas phase deposition, formed by physical vapor deposition (PVD) including vacuum evaporation, implantation techniques, and sputter deposition, and the like. It is to be appreciated that any suitable layer formation processes may be employed with the subject invention. Choice of a suitable layer formation process depends primarily on the identity of the semiconductor layer material, size of substrates being processed, and to some extent, the composition of the refractory metal layer 104 or substrate layer 100. It is important to understand that each of the various layer formation techniques has its own set of features and characteristics well known in the art.

In one embodiment, the semiconductor layer 106 may be formed using CVD techniques. Any suitable CVD techniques may be employed with the subject invention. For example, an atmospheric pressure CVD (APCVD), low-pressure CVD (LPCVD), plasma-enhanced CVD (PECVD), high density CVD (HDCVD), or high density plasma (HDP) may be employed.

The semiconductor layer 106 has a suitable thickness that depends upon the chosen implementations and/or the semiconductor device being fabricated. In one embodiment, the semiconductor layer 106 has a thickness of about 0.001 µm or more and about 10 µm or less. In another embodiment, the semiconductor layer 106 has a thickness of about 0.01 µm or more and about 5 µm or less. In yet another embodiment, the semiconductor layer 106 has a thickness of about 0.05 µm or more and about 2.5 µm or less.

In one embodiment, the semiconductor layer 106 is not doped with a salt. In another embodiment, the semiconductor layer 106 is doped with a salt. A salt is an ionic compound having an anion and cation. General examples of salts that can be employed to dope the semiconductor layer 106 include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like.

Figure 4:
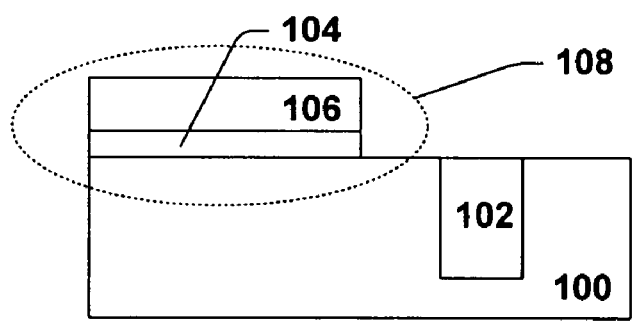

FIG. 4 shows removing a portion of the refractory metal layer 104 and the semiconductor layer 106 by etching using a fluorine-containing compound. FIG. 4 may also show forming a semiconductor device such as a diode 108 by removing the portion of the refractory metal layer 104 and the semiconductor layer 106. Removing can be carried out by any suitable etching techniques using a fluorine-containing compound. Any suitable fluorine-containing compound may be employed as an etchant. Examples of fluorine-containing compound include fluorinated carbons ($C_xF_y$, e.g., $CF_4$, $C_2F_6$, and $C_4F_8$), fluorinated hydrocarbons ($CH_xF_y$, e.g., $CHF_3$, $CH_2F_2$, and $CH_3F$), sulfur hexafluoride ($SF_6$), silicon tetrafluoride ($SiF_4$), nitrogen trifluoride ($NF_3$). Since copper is etched much slower than the refractory metal layer 104 and semiconductor layer 106, the copper portion 102 in the substrate layer 100 is substantially unetched by stopping the etching process when the desired portion of the refractory metal layer 104 and semiconductor layer 106 is removed.

Any etching process using a fluorine-containing compound can be used for removing the portion of the refractory metal layer 104 and the semiconductor layer 106 on the substrate layer 100. For example, a chemical basis etching techniques (e.g., plasma etching) or physical-chemical basis etching techniques (e.g., reactive ion etching (RIE), ion-enhanced etching) may be employed. The removing process can be employed by a lithography process followed by etching. Lithography can use both positive and negative resists, which are available commercially. Lithographic techniques for patterning thin layers in a semiconductor device are well known in the art. Choice of a suitable etching technique depends primarily on the identity of the refractory metal layer material 104 and semiconductor layer material, size of substrates being processed, and to some extent, the composition of the substrate layer material 100. It is important to understand that each of the various etching techniques has its own set of features and characteristics well known in the art.

In one embodiment, a fluorine plasma can be used for removing the portion of the refractory metal layer 104 and the semiconductor layer 106 on the substrate layer 100. Plasma etch can take place in a parallel plate reactor using an ion-assisted reactant. A fluorine-containing gas is fed into the reaction chamber. There, the fluorine plasma creates reactive species form the gas. The duration of etching is sufficient to remove the portion of the refractory metal layer 104 and the semiconductor layer 106, but not to substantially remove the substrate layer 100 and/or the copper portion 102 in the substrate layer 100. An exemplary etch conditions are as follows: about 30 sccm to about 300 sccm $CF_4$; about 1 mTorr to about 100 mTorr process chamber pressure; about 200 to about 1500 W source power; about 30 W to about 300 W substrate bias power; and about −10° C. to about 100° C. substrate temperature. Other fluorine-containing gases, such as $SF_6$ or $NF_3$, for example, can be used in place of, or in combination with, $CF_4$. The duration for the etch is controlled to avoid undesired etching of materials by controlling the introduction of fluorine-containing gas into the chamber. In one embodiment, the duration for the etch is from about 1 second to about 3 minutes. In another embodiment, the duration for the etch is from about 3 seconds to about 2 minutes. In yet another embodiment, the duration for the etch is from about 5 seconds to about 1 minute.

The fluorine-containing gas may contain any suitable additives. For example, the fluorine-containing gas may contain an oxidizer (e.g., oxygen ($O_2$), carbon monoxide (CO), or carbon dioxide ($CO_2$)) or non-reactive diluent gas (e.g., argon (Ar), hydrogen ($H_2$), helium (He), or nitrogen ($N_2$)) to control the etch rate, residue on the etch surface, or etch profile, or to improve the dissociation of fluorine species. The fluorine-containing gas may also contain a silicon-containing additive gas (e.g., silane ($SiH_4$), tetraethylorthosilicate (TEOS), diethylsilane and silicon tetrafluoride ($SiF_4$)) to diminish its silicon etching. The fluorine-containing etchant gas and the additive gas can be introduced separately or can be introduced as a mixture. In one embodiment, nitrogen may be added to the fluorine-containing plasma source gas. The amount of nitrogen added typically ranges from about 10% to about 90% of the total volumetric flow of the plasma source gas. In one embodiment, the substrate is patterned, and a portion of the semiconductor layer 106 and refractory metal layer 104 is etched using a fluorine-based chemistry comprising Ar, $CF_4$, and $CHF_3$ at a combined flow rate about from 50 sccm to about 600 sccm (e.g., Ar flow rate is about 200 sccm, $CF_4$ flow rate is about 70 sccm, and $CHF_3$ flow rate is about 35 sccm). The pressure is maintained at about 5 mTorr to about 50 mTorr and the temperature of the substrate is maintained at about 150° C. to 350° C. A bias power in the range of about 100 W to about 900 W and a source power of about 800 W to about 1800 W are delivered to the chamber.

Figure 5:
FIGS. 5 to 7 are cross sectional illustrations of a semiconductor structure undergoing fabrication according to one aspect of the subject invention.

FIG. 5 shows a cross sectional view of a substrate layer 200 having a layer 202 containing copper. The substrate layer 200 may contain any suitable substrate materials on which electric device such as a diode may be formed, including a dielectric material, a semiconductor material, an oxide material, sapphire, glass, a single semiconductor layer, a multilayer structure that includes, for example, a semiconductor device (e.g., a light-emitting diode, a semiconductor laser, an organic semiconductor, and an electronic device), polymeric resins (e.g., polyamide), and ceramics. The substrate layer 200 can be formed by any suitable techniques, including chemical vapor deposition (CVD), physical vapor deposition, spin-coating, dip-coating, or spraying. The layer 202 formed in the substrate layer 200 contains copper. The layer 202 may be copper or a copper alloy. In one embodiment, the layer 202 may contain at least 50% by weight copper.

Figure 6:
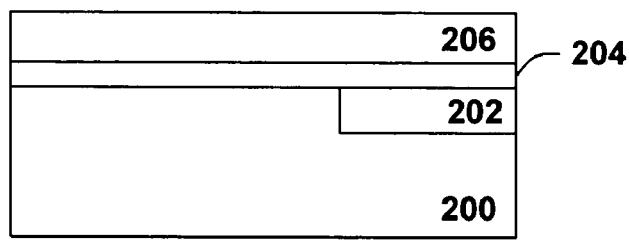

FIG. 6 shows forming a refractory metal layer 204 and a semiconductor layer 206 over the substrate layer 200. The refractory metal layer 204 contains at least one selected from W, TiW, Ta, and TaN. In one embodiment, the refractory metal layer 204 is tungsten (W) that is formed by PVD to a thickness in a range from about 50 Å to about 10,000 Å. In another embodiment, the refractory metal layer 204 is titanium-tungsten (TiW) that is formed by PVD to a thickness in a range from about 50 Å to about 10,000 Å. The semiconductor layer 206 may contain any suitable semiconductor material, including silicon (Si), germanium (Ge), gallium arsenide (GaAs), gallium nitride (GaN), and indium phosphide (InP), polysilicon, and the like. In one embodiment, the semiconductor layer 206 is Ge that is formed by CVD to a thickness in a range from about 0.05 μm to about 5 μm. In one embodiment, the semiconductor layer 206 is not doped with a salt. In another embodiment, the semiconductor layer 206 is doped with a salt.

Figure 7:
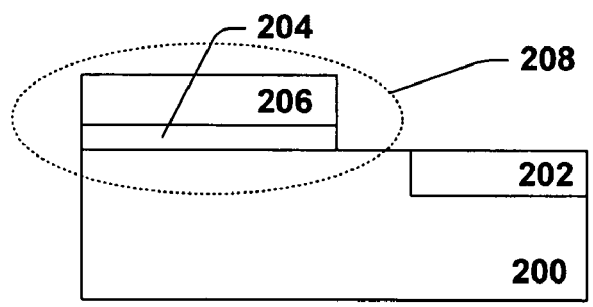

FIG. 7 shows removing a portion of the refractory metal layer 204 and the semiconductor layer 206 by etching using a fluorine-containing compound. FIG. 7 may also show forming a semiconductor device such as a diode 208 by removing the portion of the refractory metal layer 204 and the semiconductor layer 206. In one embodiment, the portion of the semiconductor layer 206 and refractory metal layer 204 is etched using a fluorine-based chemistry comprising Ar and $NF_3$ at a combined flow rate of between about from 50 to about 300 sccm (e.g., Ar flow rate is about 120 sccm and $NF_3$ flow rate is about 30 sccm). The process chamber pressure is maintained at about 3 mTorr to about 50 mTorr and the temperature of the substrate is maintained at about −10° C. to 100° C. A bias power in the range of about 30 W to about 200 W and a source power of about 300 W to about 1000 W are delivered to the chamber.

The semiconductor structure herein described can be employed for logic devices such as central processing units (CPUs); volatile memory devices such as DRAM devices, SRAM devices, and the like; input/output devices (I/O chips); and non-volatile memory devices such as EEPROMs, EPROMs, PROMs, and the like.

The semiconductor structure herein described is useful in any electronic device such as a memory. For example, the semiconductor structure is useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing a semiconductor structure, comprising:
    forming a refractory metal layer over a substrate comprising copper, the refractory metal layer comprising at least one selected form a group consisting of W, TiW, Ta, and TaN;
    forming a semiconductor layer over the refractory metal layer; and
    removing a portion of the refractory metal layer and the semiconductor layer formed on the substrate layer by etching using a fluorine-containing compound, wherein the copper in the substrate is substantially unetched by the fluorine-containing compound.

2. The method of claim 1, wherein the substrate layer further comprises a dielectric material or semiconductor material.

3. The method of claim 2, wherein the opening is a via, trench, or line.

4. The method of claim 1, wherein the substrate comprises copper in an opening therein.

5. The method of claim 1, wherein the substrate comprises copper in a layer therein.

6. The method of claim 1, wherein the semiconductor layer comprises a Group IV semiconductor, a Group III-V semiconductor, or a Group II-VI semiconductor.

7. The method of claim 1, wherein the semiconductor layer comprises Ge.

8. The method of claim 1, wherein the refractory metal layer comprises TiW and the semiconductor layer comprises Ge.

9. The method of claim 1, wherein removing the portion of the refractory metal layer and the semiconductor layer is carried out by plasma etching, reactive ion etching, or ion-enhanced etching.

10. The method of claim 1, wherein the fluorine-containing compound comprises at least one selected from the group consisting of a fluorinated carbon, a fluorinated hydrocarbon, sulfur hexafluoride, silicon tetrafluoride, and nitrogen trifluoride.

11. A method of making a diode, comprising:
    providing a substrate layer having a copper portion therein;
    forming a refractory metal layer over the substrate layer, the refractory metal layer comprising at least one selected from the group consisting of W, TiW, Ta, and TaN;
    forming a semiconductor layer over the refractory metal layer; and
    removing a portion of the refractory metal layer and the semiconductor layer formed on the substrate layer by etching using a fluorine-containing compound, wherein the copper in the substrate is substantially unetched by the fluorine-containing compound.

12. The method of claim 11, wherein the substrate layer further comprises a dielectric material or semiconductor material.

13. The method of claim 12, wherein the opening is a via, trench, or line in the substrate layer.

14. The method of claim 11, wherein the copper portion comprises an opening in the substrate layer.

15. The method of claim 11, wherein the copper portion comprises a layer in the substrate layer.

16. The method of claim 11, wherein the semiconductor layer comprises a Group IV semiconductor, a Group III-V semiconductor, or a Group II-VI semiconductor.

17. The method of claim 11, wherein the semiconductor layer comprises Ge.

18. The method of claim 11, wherein the refractory metal layer comprises TiW and the semiconductor layer comprises Ge.

19. The method of claim 11, wherein removing the portion of the refractory metal layer and the semiconductor layer is carried out by plasma etching, reactive ion etching, or ion-enhanced etching.

20. The method of claim 11, wherein the fluorine-containing compound comprises at least one selected from the group consisting of a fluorinated carbon, a fluorinated hydrocarbon, sulfur hexafluoride, silicon tetrafluoride, and nitrogen trifluoride.

* * * * *